350-3.6 SR

XR 3,712,813

SEARCH ROOM

2

SUBSTITUTE FOR MISSING XR

Jan. 23, 1973 DIETER ROSS ET AL 3,712,813

PRODUCTION OF SEMICONDUCTOR MODULES BY A PHOTO-RESIST TECHNIQUE WITH HOLOGRAPHIC PROJECTION OF ETCHING PATTERNS

Filed Dec. 15, 1970

4 Sheets-Sheet 1

Jan. 23, 1973 DIETER ROSS ET AL 3,712,813

PRODUCTION OF SEMICONDUCTOR MODULES BY A PHOTO-RESIST TECHNIQUE WITH HOLOGRAPHIC PROJECTION OF ETCHING PATTERNS

Filed Dec. 15, 1970 4 Sheets-Sheet 2

United States Patent Office 3,712,813
Patented Jan. 23, 1973

3,712,813

PRODUCTION OF SEMICONDUCTOR MODULES BY A PHOTO-RESIST TECHNIQUE WITH HOLOGRAPHIC PROJECTION OF ETCHING PATTERNS

Dieter Ross, Munich-Solln, and Horst Kiemle, Munich, Germany, assignors to Siemens Aktiengesellschaft, Berlin, Germany Filed Dec. 15, 1970, Ser. No. 98,261
Claims priority, application Germany, Dec. 19, 1969, P 19 63 787.7
Int. Cl. G03c 5/04
U.S. Cl. 96—27 H 9 Claims

ABSTRACT OF THE DISCLOSURE

In the photo-resist technique of producing integrated circuits and other semiconductor modules, a plurality of holograms of respectively different etching patterns are sequentially projected onto a light-sensitive coating of a semiconductor substrate, another fabricating step being performed after photographic development of each etching pattern thus produced. At least three register marks are holographically projected together with each of the likewise holographically projected different etching patterns appertaining to one and the same module being produced. Relative to every one of the different etching patterns, the register marks have the same shape and the same position; and after the first exposing and etching these marks appear on the substrate surface as distinct reflective areas. During each subsequent exposing, the reflective register marks on the substrate are placed in registry with the spatial image of the register marks that, due to the reconstructed register-mark wave, appear when each of the other patterns is being produced. The accurate registering is done by adjusting to a maximal value the spacing of the fringe stripes of the interference field formed by the register-mark wave which is reflected from the register marks on the substrate on the one hand and by the comparison wave which simultaneously results from the hologram reproduction and which contains a virtual image of the register marks.

Our invention relates to methods and means for producing semiconductor circuit components or modules, particularly integrated circuits by a photo-resist process which requires photographically exposing a light-sensitive coating on a substrate of semiconductor material to an etching pattern, and after subjecting the substrate to etching, performing another fabricating operation, such as doping, whereafter the photo-resist process is repeated once or several times with an intermediate other processing.

More specifically, our invention relates to a photo-resist process of the general type mentioned above, in which the etching patterns are projected holographically onto the light-sensitive coating of the substrate, thus keeping the etching pattern proper out of contact with the substrate.

The process of holographically projecting etching patterns upon a substrate is known from the paper Holographic Projection of Microcircuit Patterns, published in Electronic Letters, February 1968, vol. 4, No. 3. This process affords having a holographically recorded object reconstructed as an optically real, spatial image of high optical resolution. Used as the original subject in this process is the etching pattern to be transferred onto the substrate. The substrate surface is coated with a photo-sensitive varnish and is to be arranged during the exposure in the plane of the real image of the etching pattern.

This holographic process of projecting the etching pattern has various advantages over the conventional contact copying method in which the etching mask, representing the pattern, is in direct contact with the substrate during exposure. An essential advantage of the holographic copying process is the fact that the hologram can be used virtually as often as desired because, contrary to an etching mask directly contacting the substrate, the hologram is not subject to any mechanical strain and, by virtue of the peculiar manner of storing the image information, is also insensitive to dust and scratches.

However, since integrated circuits and other semiconductor components and modules often require the semiconductor substrate to be sequentially subjected to exposure by respectively different etching patterns, with an intermediate performance of other fabricating steps, there occurs the problem to project each subsequent etching pattern in a precisely defined position relative to the one or more etching patterns previously transferred to the substrate. In a holographic process, the necessary positional registering of the substrate, as contrasted to the contact copying method, is considerably aggravated because the positional adjusting must be performed in six, compared with only three degrees of freedom of the mechanical movement. Moreover, the conventional method of directly viewing register marks placed upon the etching masks and the substrates, is not applicable with a holographic exposing process due to the spatially separate arrangement of the substrate and the hologram containing the etching pattern.

It is an object of our invention to devise a process for precisely registering each second and following hologram, that is of each real image of the etching mask reconstructed from the hologram, relative to the etching pattern already contained on the semiconductor substrate.

To this end, and in accordance with our invention, we holographically record at least three register marks when photographically reconstructing the holograms of the respectively different patterns used in the photo-resist production of one and the same circuit module such as an integrated circuit. The area shape as well as the position of the register marks relative to the respective etching patterns is the same for all of the different patterns employed for producing the same module. When performing the first photo-etching operation, the register marks are made to appear on the substrate surface as distinct reflective areas. During the reproduction of the second and any further hologram, the spatial images of the register marks, reconstructed from the corresponding register-mark waves, are placed in precise registry with the register marks already contained on the substrate. This is done, preferably while employing a visual observation device, by adjusting to a maximal value the spacing between the stripe-shaped interference fringes resulting from the interference field between the register-mark wave reflected from the substrate on the one hand, and the comparison wave which is simultaneously produced in the reproduction of the hologram and which contains a virtual image of the register marks.

The invention is based upon the recognition that such an adjusting process affords a highly precise yet simple registering operation down to fractions of one wave length of the light being used, since extremely slight maladjustments suffice to result in well delineated interference fringes. In the industrial production of integrated circuits, even in the production of large quantities, such a registering process permits maintaining very narrow tolerance limits as to the electrical data of the individual integrated circuits produced, thus minimizing or obviating the necessity of a subsequent matching selection of the circuits or modular components for substantially identical data.

To avoid photographically exposing the substrate during the registering adjustment operations, it is preferable to record and reproduce the second and any further hologram by illuminating the register-marks with light of a different wave length not affecting the photo-sensitive varnish coating on the semiconductor substrate.

A further possibility of avoiding during the adjusting operation a detrimental illumination of the substrate by the recording of the register-marks is to cover during the adjusting operation the substrate by a mask which exposes only the register marks on the substrate to illumination, such illumination being not detrimental because the register-marks are anyhow illuminated during the exposure that transfers onto the substrate the etching patterns and the register-marks contained in these patterns.

The method according to the invention can be simplified by arranging the substrate in the region where the real image of the etching mask and the register marks reconstructed from the hologram are situated, and arranging an observing device on the side of the hologram opposite the substrate. The adjusting device is such as to permit displacing and fixing the substrate in all spatial directions within the adjusting range needed.

Applicable as holograms for the purposes of the invention are area holograms as well as volume holograms. In an area hologram the interference field is recorded in a thin surface whose thickness is but a fraction of one wave length. In a volume hologram the recording occurs in a layer whose thickness corresponds to a multiplicity of wave lengths. When the volume hologram is being reproduced to furnish an image of the etching pattern, a real image of the pattern in the optical sense, inclusive of the register marks, is produced on one side of the hologram, whereas on the other side there occurs an optically virtual image of the register marks whose image points coincide with the real image points respectively.

To permit readily absorbing the interference field, it is preferable to record the hologram in such a manner that it reproduces the register marks with a higher light intensity than the etching pattern. A further improvement in ease of operation is achieved by having the hologram reconstruct the register-mark wave at such an illuminating density that they exhibit approximately the same intensity as the reflected comparison wave in the region of interference between register-mark wave and comparison wave.

Another way of designing the holograms is to store the register marks and the etching pattern in respectively different parts or localities of the hologram.

The above-mentioned and further objects, advantages and features of our invention, said features being set forth with particularity in the claims annexed hereto, will appear from the following description with reference to the accompanying drawings in which:

Figure 3:
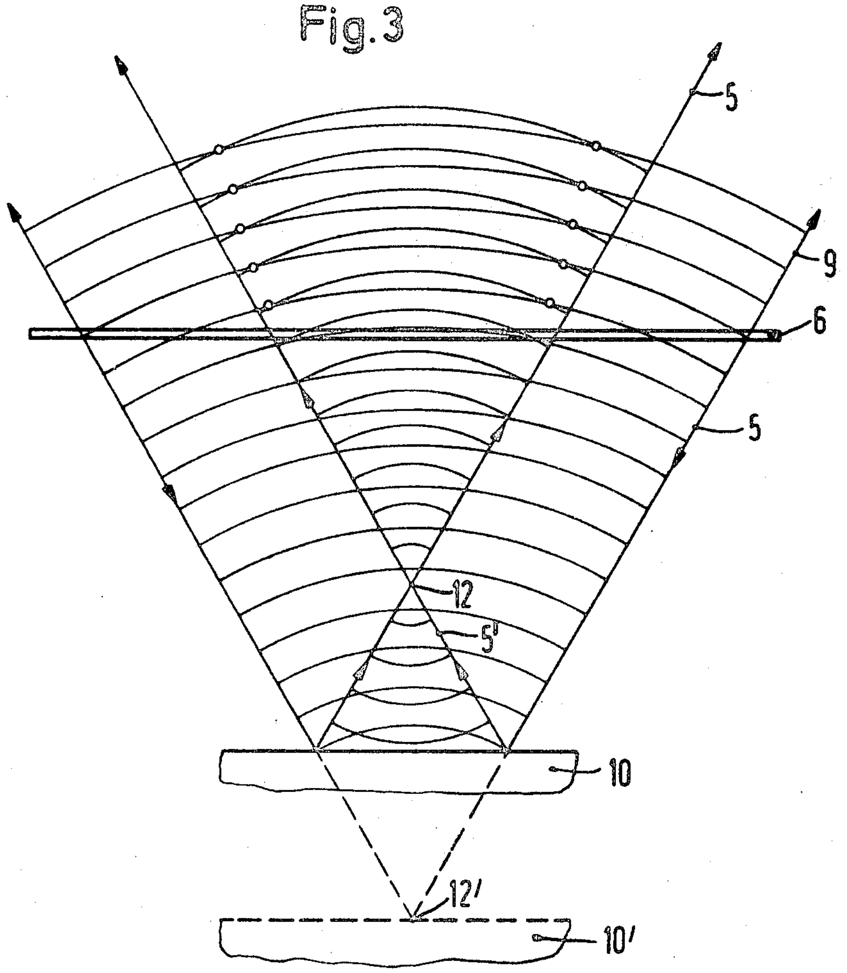

FIG. 3 diagrammatically represents the formation of the interference field utilized for register-mark adjusting purposes.

Figures 4, 5:
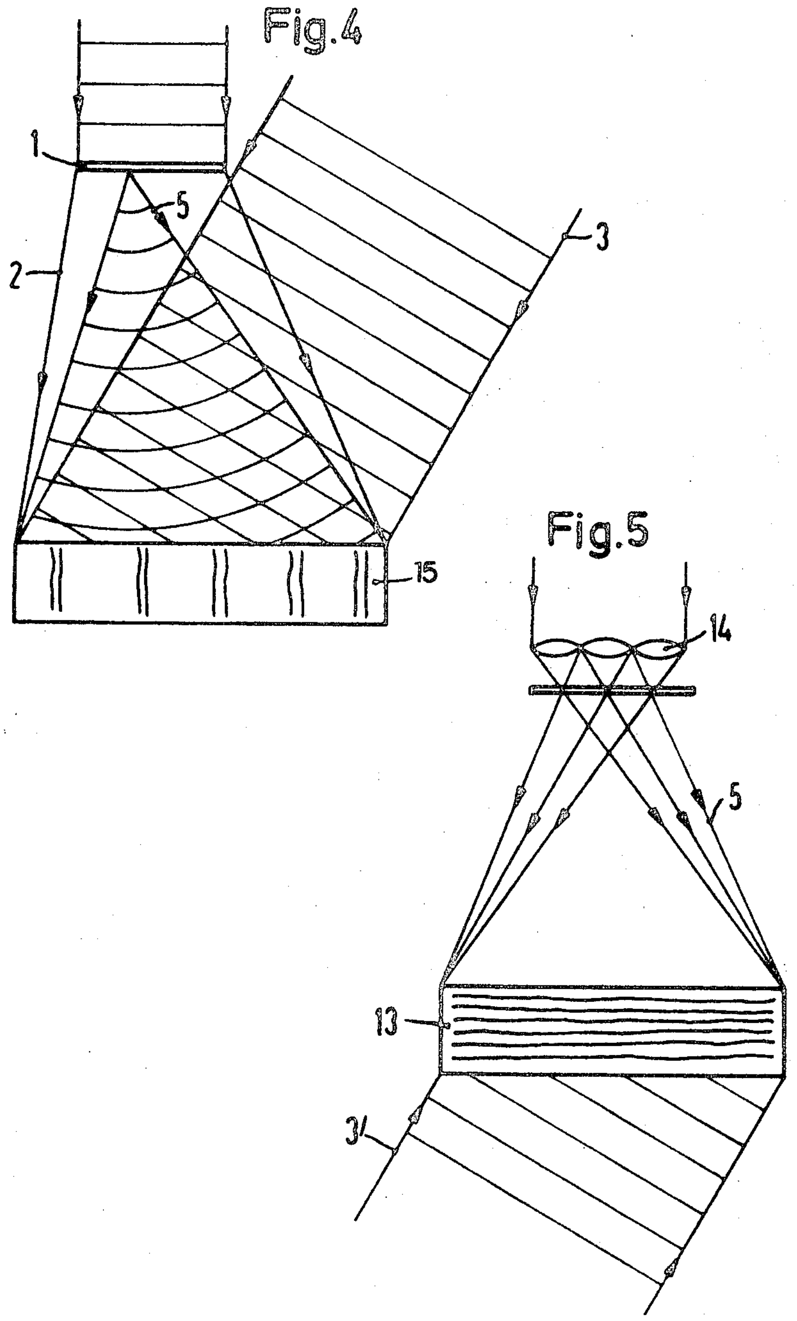

FIG. 4 is a schematic representation concerning the illumination of a volume hologram by the object wave.

Figure 6:
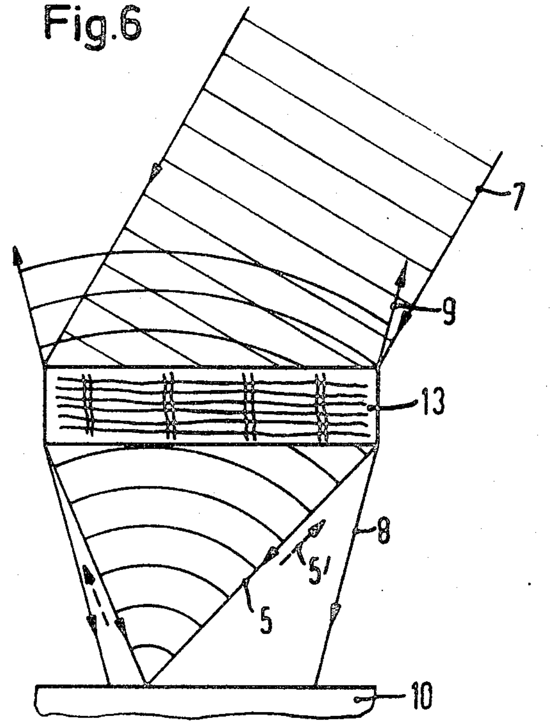

FIG. 5 shows the illumination of the same volume hologram by the comparison wave; and FIG. 6 schematically illustrates the reconstruction of this volume hologram to produce mutually registering etching patterns on a semiconductor substrate.

The same reference characters are used in all of the illustrations for corresponding items respectively.

Figures 1, 2:
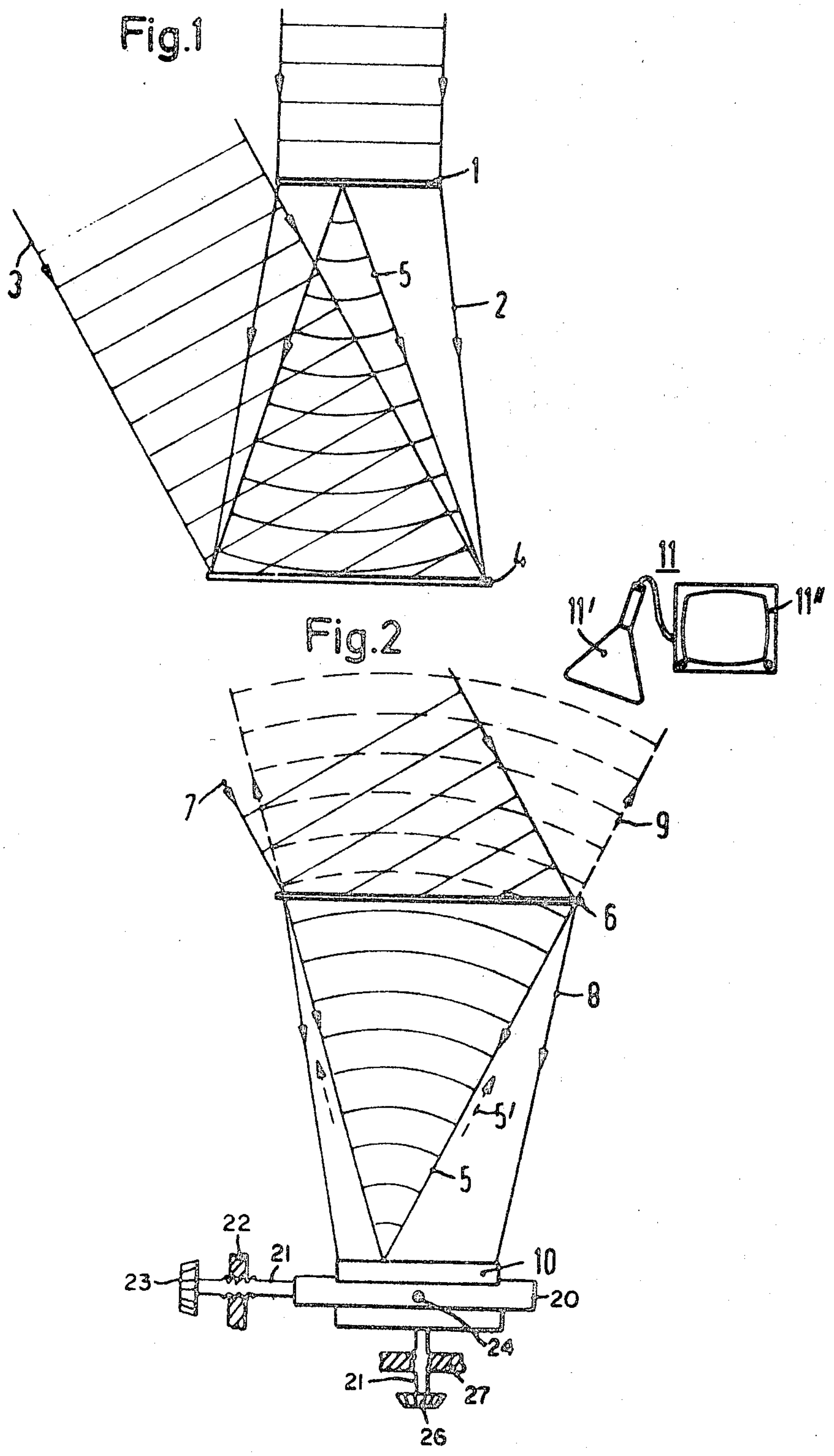
FIG. 1 is a schematic representation relating to the exposing of an area hologram.
FIG. 2 shows schematically the holographic reconstruction of the same area hologram.

Referring to FIG. 1 there is illustrated the first step of the process according to the invention, namely the illumination of the original object, here constituted by an etching mask 1 which contains the etching pattern proper as well as the register marks. The illumination is effected with a wave 1' of coherent monochromatic light, preferably from a laser. The object wave 2 issuing from the etching mask 1 is caused to interfere with the reference wave 3. The interference field is recorded photographically in the light-sensitive layer of the hologram carrier 4, such as a plate of glass covered with a photo-sensitive emulsion. The spherical wave shown in FIG. 1 within the region of the object wave 2 represents the register-mark wave 5 which issues from one of the register marks contained in the etching pattern.

As shown in FIG. 2 the hologram 6 is reconstructed with the aid of a reproducing wave 7 which corresponds to the reference wave 3 in FIG. 1, having the same frequency and spatial geometry as the reference wave. The hologram 6 in FIG. 2 is in a position rotated 180° relative to that of the hologram 4 in FIG. 1. When the hologram 6 in FIG. 2 is being illuminated, there result two waves, namely the reconstructed object wave 8 which is the transmission wave passing through the hologram 6, and the comparison wave 9 which results from the reflection of the reproducing (reference) wave 7. The reconstructed object wave 8 forms a real image, the comparison (reflected reproduction) wave 9 forms a virtual image of the etching pattern with the register marks contained therein. The virtual image points of the comparison wave 9 coincide optically with the corresponding real image points.

The substrate 10 of semiconductor material to be photographically exposed to the etching pattern is mounted on a supporting device 20 so as to be held in an already preadjusted position within the region of the real image of the etching pattern. For the initial illumination of the substrate 10, whose surface is reflecting, the substrate is simply so adjusted by means of the displaceable holder device 20 that the real image of the etching pattern is located in the light-sensitive surface layer of the substrate 10 which, for this purpose, is coated in the conventional manner with a photo-sensitive varnish.

If the substrate 10 is out of correct adjustment, the register mark wave 5' reflected from the substrate surface, upon passing through the hologram 6, forms an interference field with the comparison wave 9. This causes the occurrence of interference fringes or stripes which are observed by means of a device 11. Then the spacing between the interference stripes thus observed is adjusted to a maximal value by means of the substrate holder device 20.

The observing device 11 preferably consists of a video camera 11' in connection with a receiver 11'' on whose picture screen the interference stripes will appear. When the substrate is precisely adjusted the interference stripes will completely vanish. Also visible on the screen of the observation device 11 is the etching pattern. To prevent the visible etching pattern from detrimentally affecting the desired observation of the interference stripes, the register-marks, when photographically recording the hologram, are recorded at an intensity higher than that of the etching pattern. This can be done, for example, by an after-illumination of the register-marks.

During adjusting of the substrate 10 (FIG. 2) an opaque mask is placed upon the substrate 10 which has openings at the localities of the register marks, thus preventing an undesired illumination of the photo-sensitive varnish. Since the register marks, during the individual sequential exposures, are to remain as distinctly reflecting areas, the light-sensitive layer consists of a negative photo varnish so that during the subsequent etching the illuminated localities remain unetched.

The arrangement illustrated in FIG. 3 will elucidate occurrence and utilization of the interference field employed for the above-described registering adjustment. For clarity of illustration, the spacing of the hologram 6 from the substrate 10 is shown on a greatly reduced scale, and only one register-mark wave 5 with the appertaining comparison wave 9 is pictorially represented from among the multitude of individual waves. The substrate 10 shown by full lines is in a maladjusted position, the correctly adjusted position being shown at 10' by broken line. The register-mark wave reflected from the register mark onto the substrate passes through the hologram 6 where it becomes superimposed upon the comparison wave 9. Due to reflection at the maladjusted substrate 10, the center of the reflected register-mark wave 5' is displaced to the image point 12. Since the virtual image point 12' of the comparison wave 9 passing through the hologram 6 does not coincide with the image point 12, the super-position of the two waves results in interference-fringe stripes, this being diagrammatically indicated in FIG. 3 by the intersection points of the wave fronts identified by small circles.

As shown in FIG. 4, the exposing of the volume hologram 15 to the etching pattern and the register-marks contained in the pattern is effected in the same manner as the exposure of the area hologram according to FIG. 1. The reference wave 3 is caused to interfere with the object wave 2. After photographic development, the hologram is traversed by nearly parallel blackening strata perpendicular to the surface of the hologram. When reproducing a volume hologram exposed in this manner, the real image of the etching pattern with the register marks required for illuminating the substrate is reconstructed; but contrary to the area hologram there does not occur a comparison wave.

For that reason the register marks are recorded by an additional illuminating operation as shown in FIG. 5. The register marks are illuminatred by means of an optical device 14, and the waves 5 issuing from the register marks are caused to interfere with the reference wave 3' which, in this case, is directed onto the opposite hologram surface. The areas in which the two waves of equal phase become superimposed, here extend substantially parallel to the illuminated surface of the hologram.

With respect to the above-mentioned blackening areas or strata occurring in volume holograms, reference for further explanation may be had, if desired, to the copending application of F. Auracher Ser. No. 102,452, filed Dec. 29, 1970 based upon a German priority of Jan. 2, 1970, entitled: Holographic Method for Producing Geometrically Similar Images of Spatial Objects.

For reproducing a hologram taken in accordance with the process described with reference to FIGS. 4 and 5, the hologram is illuminated by the reproducing wave 7 as shown in FIG. 6. The reproducing wave 7 has the same geometry and frequency as the reference wave 3 or 3' employed when originally producing the hologram. In FIG. 6, the hologram 13 is placed in a position rotated 180° relative to that obtaining during exposure (FIGS. 4, 5). In similarity to the reconstruction of area holograms, the illumination of the volume hologram according to FIG. 6 results in the formation of a real image of the etching pattern with the register-marks at one side of the hologram, while at the other side of the hologram there occurs a virtual image of the register-marks, the virtual image points coinciding with the corresponding real image points. In this case, too, the superposition of the register-mark wave and comparison wave results in the formation of an interference-fringe field which can be observed in accordance with FIG. 2 with the aid of a device 11 for the purpose of setting the mutual spacing between the interference fringe stripes to a maximum.

Upon a study of this disclosure, it will be apparent to those skilled in the art that the method and means according to our invention can be modified in various respects and hence may be given embodiments other than those particularly illustrated and described herein, without departing from the essential features of our invention and within the scope of the claims annexed hereto.

We claim:

1. In the production of integrated circuits or other semiconductor modules by photographically exposing a photosensitive varnish coating on a semiconductor substrate to an etching pattern, etching the substrate through a developed pattern and repeating at least once more the exposing and etching of the substrate with a different etching pattern, the improvement in the technique of aligning register marks which comprises forming reflective alignment marks by the first of a plurality of exposures and the development of the substrate, and subsequently obtaining the alignment of succeeding holographic images using an interferometric technique including the alignments on the substrate with the virtual images of aligning marks of succeeding images and adjusting to zero interference fringes between them.

2. The improvement in method according to claim 1, wherein the interferometric technique comprises observing the spacing of the interference-fringe stripes caused by the register-mark wave reflected from the register marks on the substrate, and by the comparison wave which simultaneously results from the hologram reproduction and which contains a virtual image of the register marks; and adjusting the spacing between said interference stripes to a maximal value.

3. The improvement according to claim 2 which includes displacing the substrate to thereby adjust said spacing between the interference-fringe stripes.

4. The improvement according to claim 2, wherein the register marks are exposed when forming the holographic images and which includes reproducing the register marks, during the alignment and registry thereof, with light of a wavelength to which the photosensitive varnish coating is insensitive.

5. The improvement according to claim 2, which includes masking the substrate during adjusting of said interference-fringe spacing, leaving unmasked only the register marks on the substrate.

6. The improvement according to claim 2, wherein said holograms are area holograms.

7. The improvement according to claim 2, wherein said holograms are volume holograms which, when being reproduced, produce on one side a real image of the etching pattern with the register marks contained therein, and on the opposite side a virtual image of the register marks whose virtual image points coincide with the corresponding real image points respectively.

8. The improvement according to claim 7, wherein the register mark of at least the hologram first exposed and reproduced is given a higher brightness than the etching pattern.

9. The improvement according to claim 7, which comprises recording the register-mark wave on the hologram with an intensity necessary for said register-mark wave to be of approximately the same intensity as that of the comparison wave in the field of interference produced by said register-mark wave and said comparison wave during subsequent reproduction of the hologram.

References Cited

UNITED STATES PATENTS

| | | | |
|---|---|---|---|
| 3,526,505 | 9/1970 | Kroemer | 96—36.2 |
| 3,537,854 | 11/1970 | Grobin, Jr. et al. | 96—36.2 |
| 3,582,177 | 6/1971 | Kiemle | 96—36.2 |

OTHER REFERENCES

Gottenberg: Expermental Mechanics, vol. 8, pp. 405–7 (September 1968).

Brandt: Electro-Technology, April 1968, pp. 67–70.

J. TRAVIS BROWN, Primary Examiner

E. C. KIMLIN, Assistant Examiner

U.S. Cl. X.R.

96—36.2